US012464809B2

(12) United States Patent
Fan et al.

(10) Patent No.: US 12,464,809 B2
(45) Date of Patent: Nov. 4, 2025

(54) VERTICAL FIELD EFFECT TRANSISTOR WITH MINIMAL CONTACT TO GATE EROSION

(71) Applicant: International Business Machines Corporation, Armonk, NY (US)

(72) Inventors: Su Chen Fan, Cohoes, NY (US); Christopher J. Waskiewicz, Rexford, NY (US); Yann Mignot, Slingerlands, NY (US); Jeffrey C. Shearer, Albany, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 811 days.

(21) Appl. No.: 17/551,950

(22) Filed: Dec. 15, 2021

(65) Prior Publication Data

US 2023/0187442 A1   Jun. 15, 2023

(51) Int. Cl.
*H10D 84/83* (2025.01)
*H10D 30/01* (2025.01)
*H10D 30/62* (2025.01)
*H10D 30/67* (2025.01)
*H10D 62/13* (2025.01)
*H10D 84/01* (2025.01)
*H10D 84/03* (2025.01)

(52) U.S. Cl.
CPC ......... *H10D 84/834* (2025.01); *H10D 30/024* (2025.01); *H10D 30/6211* (2025.01); *H10D 62/151* (2025.01); *H10D 84/013* (2025.01); *H10D 84/0158* (2025.01); *H10D 84/038* (2025.01)

(58) Field of Classification Search
CPC .............. H10D 84/834; H10D 30/024; H10D 84/0158; H10D 30/6728; H10D 84/016; H10D 84/83; H10D 84/013; H10D 84/0149; H10D 84/0151; H10D 30/63; H10D 30/025; H10D 30/6219
See application file for complete search history.

(56) References Cited

U.S. PATENT DOCUMENTS

| 9,761,491 | B1 | 9/2017 | Huang et al. |
| 9,773,708 | B1 | 9/2017 | Zhang et al. |
| 9,882,025 | B1 | 1/2018 | Zhang |
| 10,217,863 | B2 * | 2/2019 | Mochizuki ............. H10D 30/63 |
| 10,230,000 | B2 | 3/2019 | Bourjot et al. |
| 10,283,608 | B2 | 5/2019 | Zhang et al. |

(Continued)

OTHER PUBLICATIONS

Z.-F. Han et al., "A Simulation Study of Vertical Tunnel Field Effect Transistors," IEEE 9th International Conference on ASIC, Oct. 25-28, 2011, pp. 665-668.

(Continued)

*Primary Examiner* — Sonya McCall-Shepard
(74) *Attorney, Agent, or Firm* — Samuel Waldbaum; Ryan, Mason & Lewis, LLP

(57) ABSTRACT

A semiconductor device comprises a substrate including at least one vertical fin extending from the substrate, a bottom source/drain region beneath the at least one vertical fin, a top source/drain region disposed above the at least one vertical fin, a metal gate structure, a contact coupled to the top source/drain region and first and second contact spacers disposed on each side of the contact.

20 Claims, 5 Drawing Sheets

(56) References Cited

U.S. PATENT DOCUMENTS

| | | | |
|---|---|---|---|
| 10,461,186 B1 | 10/2019 | Zhang et al. | |
| 10,505,048 B1 | 12/2019 | Xu et al. | |
| 2018/0083136 A1* | 3/2018 | Xie | H10D 64/252 |
| 2018/0254218 A1* | 9/2018 | Cheng | H10D 84/038 |

OTHER PUBLICATIONS

H. Lee et al., "Performance Booster for Vertical Tunnel Field-Effect Transistor: Field-Enhanced High-k Layer," IEEE Electron Device Letters, Sep. 7, 2016, pp. 1383-1386, vol. 37, No. 11.

Z. Liu et al., "Direct Partition Measurement of Parasitic Resistance Components in Advanced Transistor Architectures," Symposium on VLSI Technology Digest of Technical Papers, Jun. 9-14, 2019, 2 pages.

* cited by examiner

VERTICAL FIELD EFFECT TRANSISTOR WITH MINIMAL CONTACT TO GATE EROSION

BACKGROUND

The present disclosure relates generally to semiconductor devices, and more specifically, relates to a vertical field effect transistor (VFET) structures. A vertical field effect transistor (VFET) device includes a vertical fin extending from a semiconductor substrate. The vertical fin forms a vertical channel extending between a source region and a drain region of the semiconductor. In general, a VFET device is designed to have one or more gates that are formed on multiple sides of the vertical channel (e.g., a vertical semiconductor fin or vertical nanowire). The gates of the VFET device control the flow of electric current through the channel and between the source and drain regions. The perpendicular arrangement of the vertical fin in a VFET device increases packing density and improves scaling limitations relative to a conventional field effect transistor (FET).

SUMMARY

In illustrative embodiments, a semiconductor device comprises a substrate including at least one vertical fin extending from the substrate, a bottom source/drain region beneath the at least one vertical fin, a top source/drain region disposed above the at least one vertical fin, a metal gate structure, a contact coupled to the top source/drain region and first and second contact spacers disposed on each side of the contact.

In other illustrative embodiments, a semiconductor device comprises a substrate including first and second vertical fins extending from the substrate, a bottom source/drain region beneath each of the first and second vertical fins, a top source/drain region disposed above each of the first and second vertical fins, a metal gate structure at least partially surrounding each of the first and second vertical fins, first and second contacts respectively contact coupled to the top source/drain regions above each of the first and second vertical fins and contact spacers segments disposed on each side of the first and second contacts where the contact spacer segments comprising a dielectric material.

In another illustrative embodiment, a method comprises forming at least one vertical fin on a substrate, forming a bottom source/drain region beneath the at least one vertical fin, forming a top source/drain region disposed above the at least one vertical fin, forming a metal gate structure adjacent the at least one vertical fin, forming a contact coupled to the top source/drain region and forming first and second dielectric contact spacers on each side of the contact.

BRIEF DESCRIPTION OF THE DRAWINGS

FIG. 1 is a cross-sectional view illustrating the semiconductor device including a substrate, a pair of vertical fins extending from the substrate, top and bottom source/drain regions and gate structures disposed relative to the vertical fins at a first intermediate stage of fabrication of the semiconductor structure according to one or more illustrative embodiments.

FIG. 2 is a cross-sectional view similar to the view of FIG. 1 illustrating the semiconductor structure with a metal oxide layer formed on the top source/drain regions at a second intermediate stage of fabrication of the semiconductor device according to one or more illustrative embodiments.

FIG. 3 is a cross-sectional view similar to the view of FIG. 2 illustrating formation of contact spacers above the top source/drain regions at a third intermediate stage of fabrication of the semiconductor device according to one or more illustrative embodiments.

FIG. 4 is a cross-sectional view similar to the view of FIG. 3 illustrating deposition of a hard mask layer on the semiconductor structure at a fourth intermediate stage of fabrication of the semiconductor device according to one or more illustrative embodiments.

FIG. 5 is a cross-sectional view similar to the view of FIG. 4 illustrating removal of the metal oxide layers at a fifth intermediate stage of fabrication of the semiconductor device according to one or more illustrative embodiments.

FIG. 6 is a cross-sectional view similar to the view of FIG. 5 illustrating deposition of a contact layer at a sixth intermediate stage of fabrication of the semiconductor device according to one or more illustrative embodiments.

FIG. 7 is a cross-sectional view similar to the view of FIG. 6 illustrating polishing of the contact layer to form the contacts coupled to the top source/drain regions and encapsulated by the contact spacers at a seventh intermediate stage of fabrication of the semiconductor device according to one or more illustrative embodiments.

FIG. 8 is a cross-sectional view illustrating one exemplative embodiment where an intermediate metal segment of the deposited metal contact material is disposed between contact spacers of adjacent transistor structures according to one or more illustrative embodiments.

FIG. 9 is a cross-sectional view illustrating one exemplative embodiment where an intermediate dielectric segment is disposed between contact spacers of adjacent transistor structures according to one or more illustrative embodiments.

DETAILED DESCRIPTION

Figure 1:
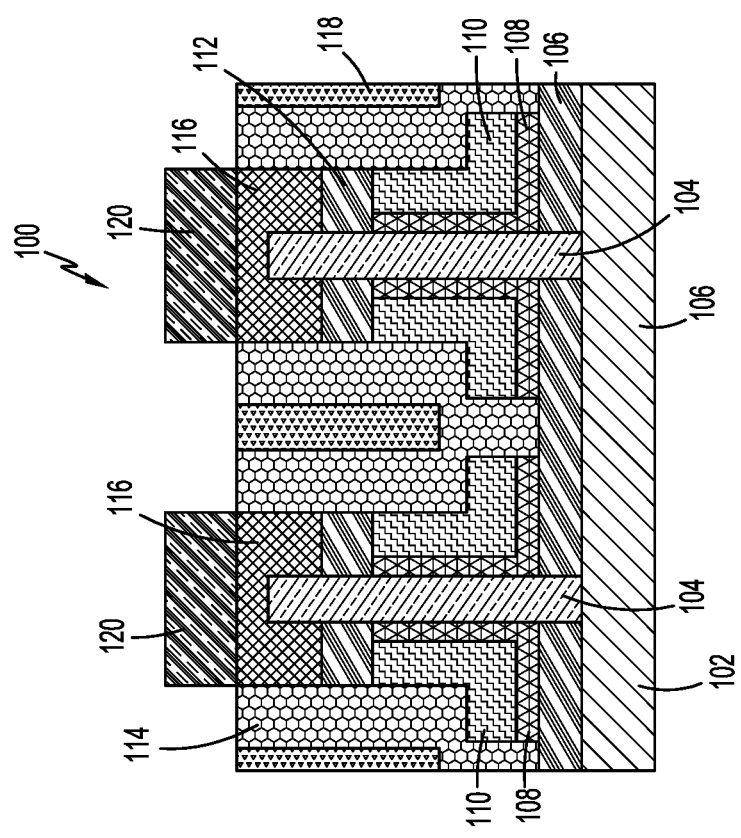
FIGS. 1-9 schematically illustrate methods for fabricating a semiconductor device including one or more VFETs according to one or more illustrative embodiments.

Illustrative embodiments of the disclosure will now be described with regard to methods for fabricating semiconductor substrates with uniform structural profiles, as well as semiconductor devices comprising one or more VFETs with uniform structural profiles. Semiconductor fabrication methods for VFETs according to illustrative embodiments implement a process flow to fabricate contacts with the top source/drain regions and dielectric spacers at least partially circumscribing the contacts, which minimizes erosion of the contact to gate structure within the semiconductor device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure is not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a VFET device according to illustrative embodiments utilize a variety of individually known physical and chemical processes performed on a semiconductor (e.g., silicon) substrate, some of which are described in the immediately following paragraphs.

In the discussion that follows, the semiconductor structure, which will incorporate one or more VFET devices, will be referred to as the "semiconductor structure 100" throughout the various stages of fabrication, as represented in all the accompanying drawings.

Methods for fabricating a semiconductor structure 100 comprising one or more VFET devices will now be discussed in further detail with reference to FIGS. 1 through 9, which schematically illustrate a semiconductor structure 100 incorporating one or more VFET devices at various stages of fabrication. With initial reference to FIG. 1, there is schematically illustrated, in a cross-sectional view, a semiconductor structure 100 at an early or intermediate stage of fabrication where several processes have been previously performed. At this stage of fabrication, the semiconductor structure 100 includes a semiconductor substrate 102 defining a longitudinal axis "K" and a pair of vertical fins 104 extending upwardly from the semiconductor substrate 102. In addition, as appreciated, the semiconductor structure 100 may incorporate many sets or pairs of vertical fins extending from the semiconductor substrate 102.

The semiconductor substrate 102 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g., III-V and II-VI). Non-limiting examples of compound semiconductor materials include gallium arsenide, indium arsenide, and indium phosphide. In another embodiment, the semiconductor substrate 102 may comprise an active semiconductor layer (e.g., silicon layer, SiGe layer, III-V compound semiconductor layer, etc.) of a SOI (silicon on insulator) substrate, which comprises an insulating layer (e.g., oxide layer) disposed between a base substrate layer (e.g., silicon substrate) and the semiconductor substrate 102 in which active circuit components (e.g., VFET devices) are formed as part of a front-end-of-line (FEOL) layer.

The vertical fins 104 are generally normal to, or perpendicular to, the semiconductor substrate 102. Each of the vertical fins 104 may include a fin cap (not shown) at an upper end thereof. The vertical fins 104 may be formed simultaneously with the semiconductor substrate 102 during the same patterning process, such as, self-aligned double patterning or self-aligned quadruple patterning. The vertical fins 104 may be formed, e.g., by removing material from the semiconductor substrate 102 using a photolithography process followed by an anisotropic etching process such as reactive ion etching (RIE) or plasma etching. Other methods of forming the vertical fins 104 known in the art may also be utilized, such as sidewall image transfer (SIT) process.

With continued reference to FIG. 1, the semiconductor structure 100 further includes one or more bottom source/drain regions 106 disposed beneath the vertical fins 104. The one or more bottom source drain regions may be continuous or comprise separate regions beneath each vertical fin 104. A shallow trench isolation (STI) region (not shown) may be disposed between the vertical fins 104. In illustrative embodiments, the bottom/source drain region 106 may be in-situ doped wherein dopants are incorporated into the bottom source/drain region 106 during epitaxial growth of the bottom source/drain region. For example, for n-type VFET devices, the bottom source/drain region may comprise a doped epitaxial silicon (Si) material, and for p-type VFET devices, the bottom source/drain region 106 may comprise a doped epitaxial silicon-germanium (SiGe) layer. It is to be understood that the term "source/drain region" as used herein means that a given source/drain region can be either a source region or a drain region, depending on the application or circuit configuration.

In other illustrative embodiments, the bottom source/drain region 106 may be formed via an ion implantation process(es). In one illustrative embodiment, the bottom source drain region 106 may comprise N-type dopant or P-type dopant atoms formed by introducing dopant atoms during one or more ion implantation processes with the use of patterned implant masks (not shown). In illustrative embodiments, the bottom source/drain region 106 may be formed by ion implantation or epitaxially grown silicon including Si:P for n-type devices or Si:GeB for p-type devices. The implantation processes performed on the bottom/source drain region 106 may occur before or after the formation of the vertical fins 104.

With continued reference to FIG. 1, the semiconductor structure 100 further includes a gate structure or gate dielectric stack including, e.g., a conformal high-k liner 108 and a work function metal 110 deposited onto the semiconductor structure 100. The conformal high-k liner 108 may be formed by depositing one or more conformal layers of dielectric material over the surface of the semiconductor structure 100. The conformal high-k liner 108 may comprise a high-k dielectric material having a dielectric constant of about 3.9 or greater. In illustrative embodiments, the conformal high-k liner 108 includes, but is not limited to, silicon oxide or any other suitable material such as SiO2 and a high-k (HfOx). The conformal high-k liner 108 is deposited using known methods such as atomic layer deposition (ALD), e.g., which allows for high conformality of the gate dielectric material.

The work function metal 110 may be formed by depositing a conductive material including, but not limited to titanium nitride (TiN), titanium aluminum nitride (TiAlN) and/or combinations thereof. Other suitable materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. In embodiments, the work function metal 110 includes one or more of TiN, TiAlC or combinations thereof. The work function metal 110 may further comprise dopants that are incorporated during or after deposition. The work function metal 110 is deposited using a suitable deposition process, e.g., CVD, plasma-enhanced chemical vapor deposition (PECVD), PVD, plating, thermal or e-beam evaporation, sputtering, etc.

Referring still to FIG. 1, the semiconductor structure further includes top spacers 112 comprising silicon nitride (SiN), silicon oxycarbonitride (SiOCN), or boron-modified silicon carbonitride (SiBCN) disposed on the gate structure including the work function metal 110. The top spacers 112 may encapsulate the upper portion of the vertical fins 104. The top spacers 112 may be deposited via any of the aforementioned directional deposition techniques. An outer insulative layer 114 is disposed around the periphery of the semiconductor structure including the top spacers 112, the gate structure and about the top surface portions of the vertical fins 104. The outer insulative layer 114 may be about 3 nm in thickness although other thicknesses are contemplated. The outer insulative layer 114 may include a dielectric/insulating material such as silicon nitride (SiN) and/or silicon oxide (SiO2), and is formed using well-known deposition and etching techniques. In one illustrative embodiment, the outer insulative layer 114 is formed by depositing a conformal spacer layer, and performing a RIE process.

With continued reference to FIG. 1, the semiconductor structure 100 includes top source/drain regions 116 which may be formed sequentially on the top spacers 112 enclosed within the outer insulative layer 114 on each vertical fin 104. For example, the top source/drain regions 116 may include one or more epitaxial layers formed via epitaxial growth processes or formed by incorporating N-type and P-type dopants as described hereinabove in connection with the bottom source/drain region 106. The top source/drain regions 116 may be n-doped and/or p-doped. The top source/drain regions 116 may be flush with the upper surface of the semiconductor structure 100 or recessed relative to upper surface of the semiconductor structure 100. In illustrative embodiments, the top source/drain regions 116 comprise silicon germanium (SiGe).

The semiconductor structure 100 further includes an outer layer 118 disposed about the periphery of the semiconductor structure 100. The outer layer 118 is an insulator and may comprise silicon oxide or any other suitable dielectric material. The outer layer is formed via known deposition processes, and may be subject to one or more CMP processes.

Figure 2:
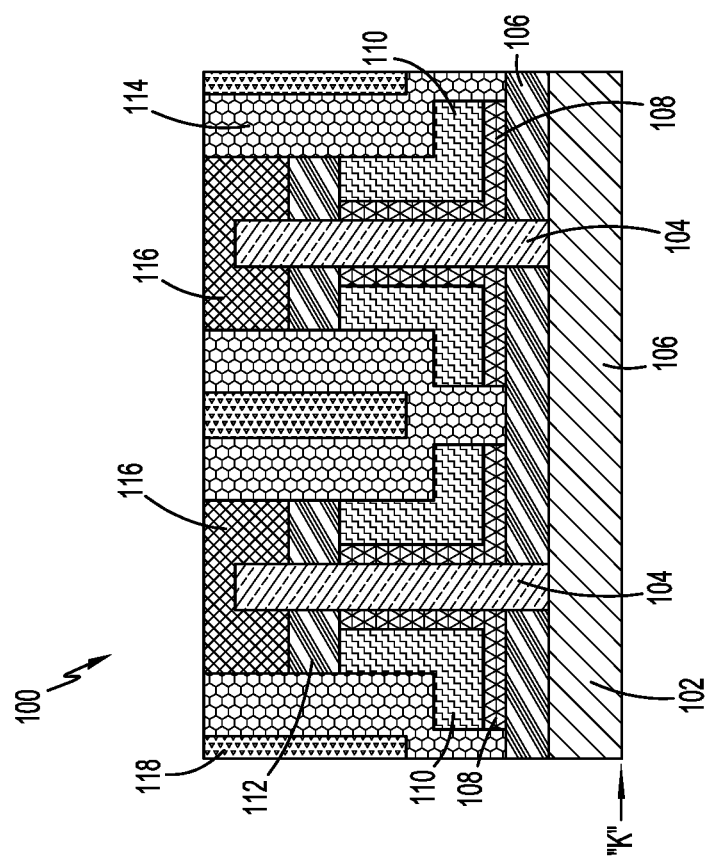

Referring now to FIG. 2, in a second intermediate stage of fabrication, a metal oxide layer 120 is selectively grown on each of the top source/drain regions 116. The metal oxide layers 120 may comprise any metal oxide suitable for growth on the top source/drain regions 116, which in illustrative embodiments, may comprise silicon germanium (SiGe). Examples of suitable metal oxides include aluminum oxide ($AlO_x$), hafnium oxide ($HfO_x$), titanium oxide ($TiO_x$) and zirconium oxide ($ZrlO_x$).

Figure 3:
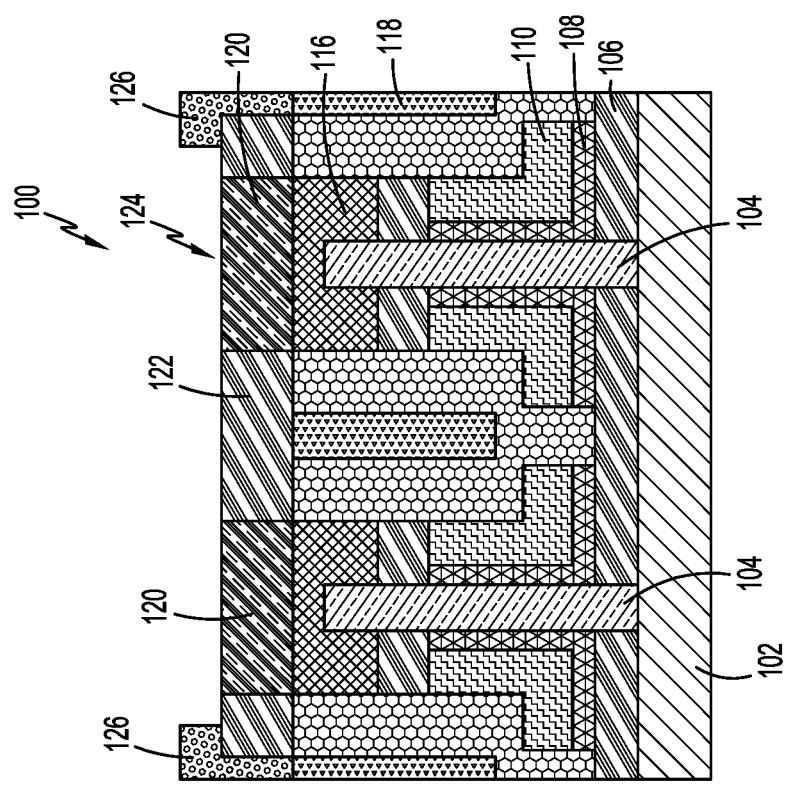

With reference to FIG. 3, representing a third intermediate stage of fabrication, a dielectric material is deposited via known techniques onto the semiconductor structure including the outer insulative layer 114. The dielectric material may include any suitable dielectric material including, for example, silicon nitride (SiN), silicon carbon nitride (SiCN) and silicon oxycarbonitride (SiOCN). The dielectric layer is subjected to one or more removal techniques including an RIE process to form contact spacers 122 on each side of the metal oxide layers 120 on the top source/drain regions 116.

Figure 4:
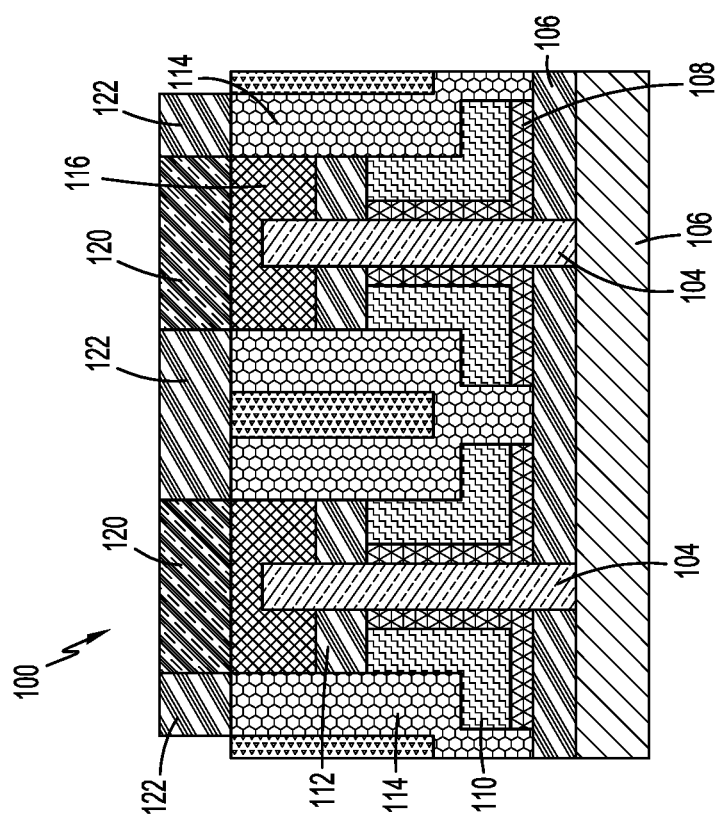

Referring now to FIG. 4 illustrating a fourth intermediate stage of fabrication, a hard mask layer is deposited on the top of the semiconductor structure 100 including the outer insulative layer 114, the contact spacers 122 and the metal oxide layers 120 to blanket these components. Any suitable dielectric material may be used as a hard mask layer including SiO2, spin-on-glass (SOG) or spin-on-carbon (SOC). In illustrative embodiments, the hard mask layer may comprise a metal oxide including titanium oxide (TiOx), SiARC, SiON, SiO2 TiARC, etc. Other materials may also be contemplated. The hard mask layer is formed of a different material than the contact spacers 122. Thereafter through one or more lithographic and removal procedures (including, for example, an RIE process), a window 124 is formed in the hard mask layer defined between an outer periphery 126 of the remaining hard mask layer. The window exposes the underlying metal oxide layers 120.

Figure 6:
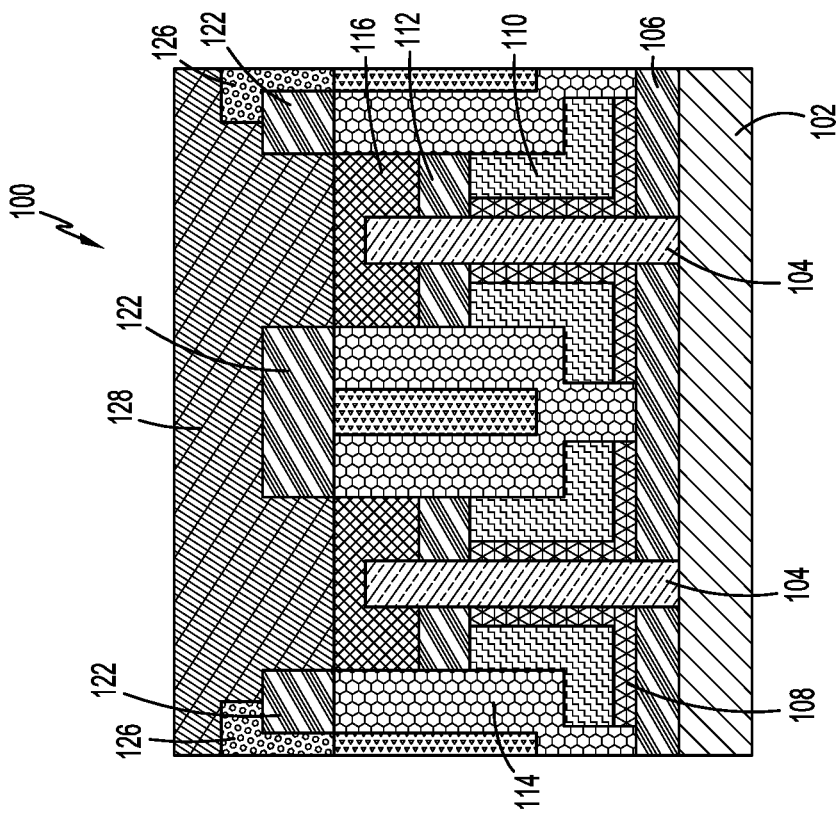
Figure 5:
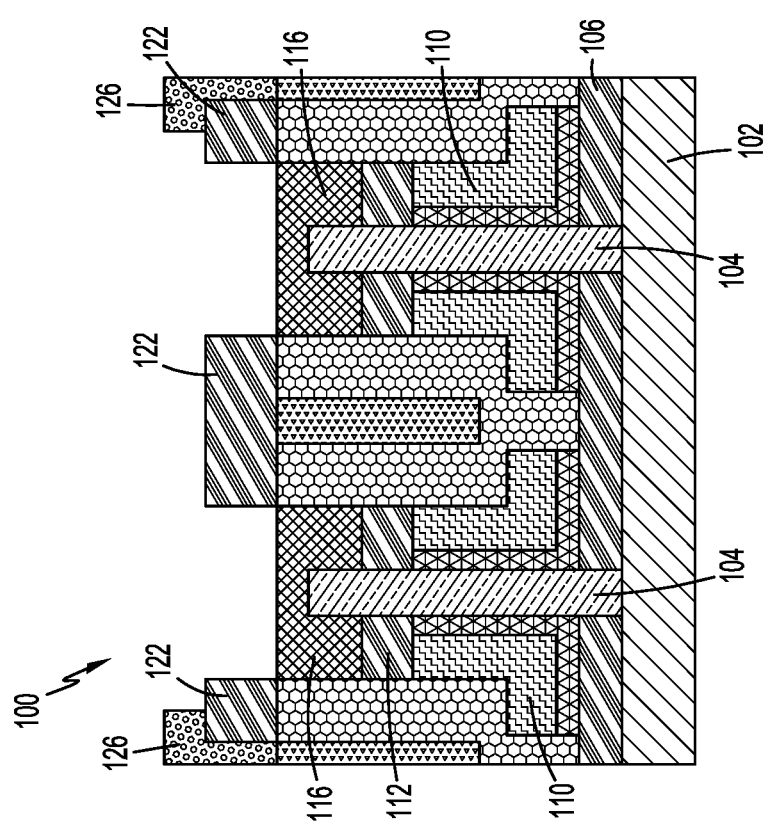

Referring now to FIG. 5 illustrating a fifth intermediate stage of fabrication, the metal oxide layers 120 exposed through the window 124 of the hard mask layer are removed by one or more removal processes include an RIE procedure. As shown in FIG. 6, representing a sixth intermediate stage of fabrication, the upper surfaces of the top source/drain regions 116 may be subjected to one or more conventional diffusion processes to establish an interface. Thereafter, through one or more deposition processes, a suitable metal containing material 128 is deposited onto the semiconductor structure 100 at least through the window 124 to contact the top source/drain regions 116. Exemplative metal materials includes metal silicide TiSix, CoSix, or NiSix, with a metal liner of TiN or TaN, and bulk fill metal including tungsten (W), cobalt (Co), ruthenium (Ru) and copper (Cu) and/or combinations thereof.

Figure 7:
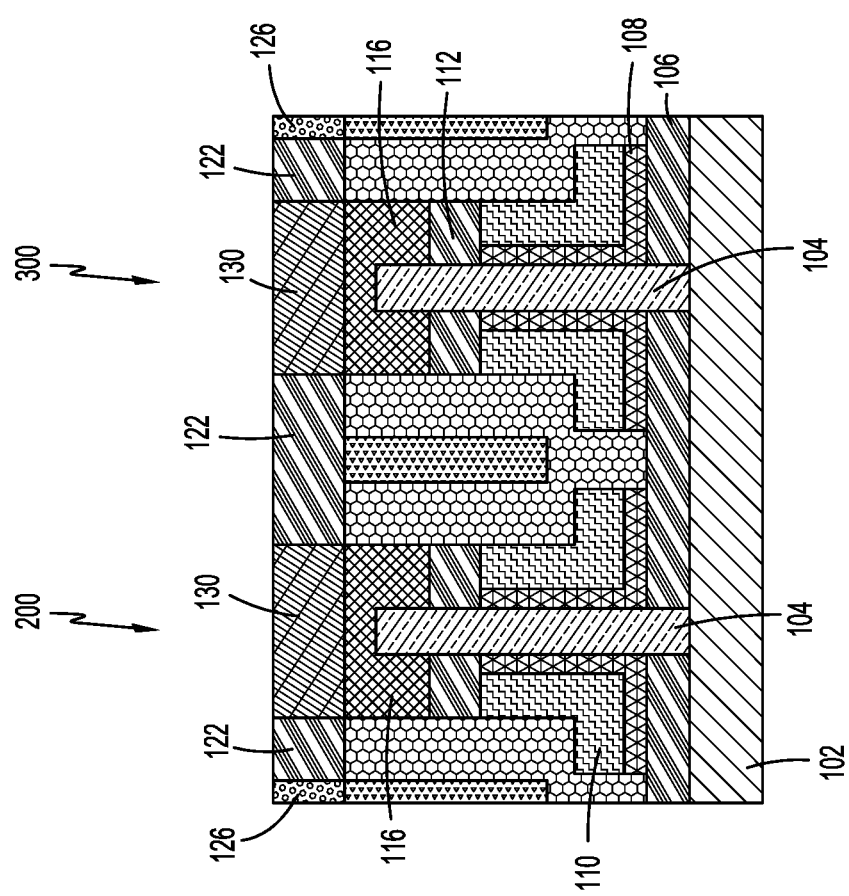

With reference to FIG. 7, representing a seventh intermediate stage of fabrication, the deposited metal containing material 128 is subjected to one or more metal CMP processes to reduce excess metal material and form metal contacts 130 coupled to each of the top source/drain regions 116. Thus, the formed semiconductor structure 100 includes at least one transistor structure 200 having a single vertical fin 104, a top source/drain region 116 and a metal contact 130 enclosed by the contact spacers 122, i.e., a contact spacer 122 is disposed on each side of the metal contact 130. The contact spacers 122 advantageously minimize or eliminate contact to gate breakdown realized by conventional transistor devices. More specifically, the contact spacers 122 will not erode thereby maintaining proper distancing between the metal contact 130 and the underlying gate structure 108/110. In illustrative embodiments, the semiconductor structure 100 includes two transistor structures 200, 300 each with a respective top source/drain region 116 and metal contact 130 enclosed by contact spacers 122.

Figures 8, 9:
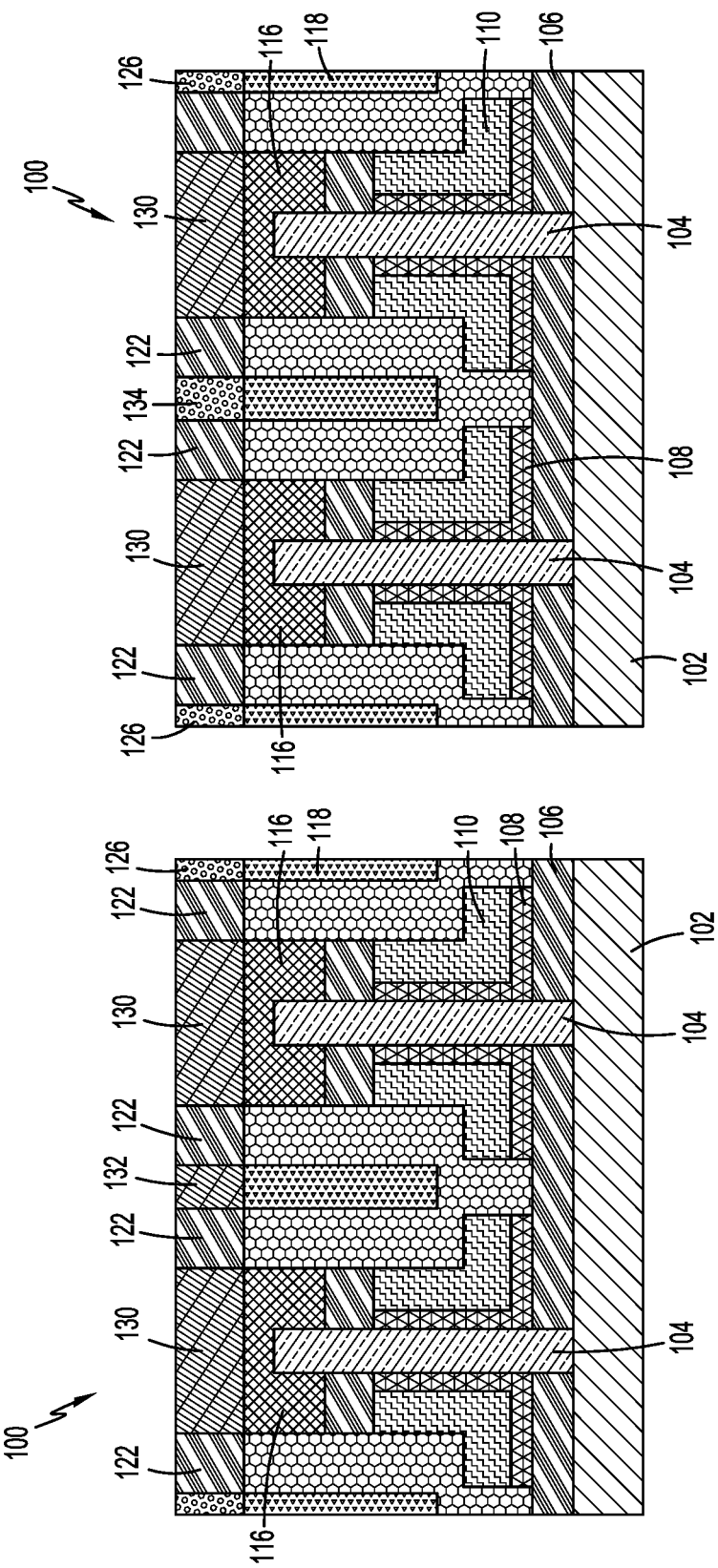

FIG. 8 illustrates one exemplative embodiment wherein an intermediate metal segment 132 of the deposited metal contact material is disposed between contact spacers 122 of adjacent transistor structures 200, 300. FIG. 9 illustrates an embodiment wherein an intermediate mask or dielectric segment 134 of the hard mask layer is disposed between contact spacers 122 of adjacent transistor structures 200, 300. This may be achieved via conventional lithographic processes in conjunction with forming the window 124 in the hard mask layer as described hereinabove in connection with FIG. 4.

As a further alternative material, the contact spacers 122 may be removed prior to deposition of the metal contact material to connect the metal contacts 130, for example, form one contact connecting both top source/drain regions 116 to form a double fin structure.

Following the formation of the semiconductor structure 100, any known sequence of processing steps can be implemented to complete the fabrication of the VFET device, the details of which are not needed to understand embodiments of the disclosure. Briefly, by way of example, using, e.g., known lithographic and etching processes, additional trenches and/or via openings may be formed to enable formation of gate contacts or other electrical contacts.

Following formation of the semiconductor structure, a BEOL (back end of line) interconnect structure is formed to provide connections to/between the VFET devices and other active or passive devices that are formed as part of the FEOL layer.

Advantageously, illustrative embodiments as described herein provide semiconductor fabrication techniques exhibiting minimal contact to gate breakdown thereby enhancing the functionality of a VFET structure in a semiconductor device.

It is to be understood that the methods discussed herein for fabricating VFET devices with uniform structural profiles can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present disclosure can be employed in applications, hardware, and/or electronic systems. Suitable hardware and systems for implementing the disclosure may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the disclosure provided herein, one of ordinary skill in the art will be able to contemplate other implementations and applications of the techniques of the disclosure.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

What is claimed is:

1. A semiconductor device, comprising:
a substrate including at least one vertical fin extending from the substrate;
a bottom source/drain region beneath the at least one vertical fin;
a top source/drain region disposed above the at least one vertical fin;
a metal gate structure;
a contact coupled to the top source/drain region;
first and second contact spacers disposed on each side of the contact; and
an insulative layer disposed abutting a bottom surface of the first and second contact spacers, abutting sidewall portions of the top source/drain region and sidewall portions of the metal gate structure, and a top surface of the bottom source/drain region.

2. The semiconductor device according to claim 1 wherein the first and second contact spacers comprise a dielectric material configured to minimize erosion between the contact and the metal gate structure.

3. The semiconductor device according to claim 2 wherein the dielectric material of the first and second contact spacers comprise at least one of silicon nitride, silicon carbon nitride and silicon oxycarbonitride.

4. The semiconductor device according to claim 2 further including a hard mask segment disposed adjacent a peripheral segment of at least one of the first and second contact spacers, the hard mask segment comprising a dielectric material.

5. The semiconductor device according to claim 4 wherein the dielectric material of the hard mask segment is different from the dielectric material of the first and second contact spacers.

6. A semiconductor device, comprising:
a substrate including first and second vertical fins extending from the substrate;
a bottom source/drain region beneath each of the first and second vertical fins;
a top source/drain region disposed above each of the first and second vertical fins;
a metal gate structure at least partially surrounding each of the first and second vertical fins;
first and second contacts respectively contact coupled to the top source/drain regions above each of the first and second vertical fins;
first and second contact spacer segments disposed on each side of the first and second contacts, the first and second contact spacer segments comprising a dielectric material; and
an insulative layer disposed abutting a bottom surface of the first and second contact spacer segments, abutting sidewall portions of the top source/drain region and sidewall portions of the metal gate structure, and a top surface of the bottom source/drain region.

7. The semiconductor device according to claim 6 wherein adjacent contact spacer segments on adjacent sides of the first and second contacts are in contact with each other.

8. The semiconductor device according to claim 6 wherein adjacent contact spacer segments on adjacent sides of the first and second contacts are spaced relative to each other.

9. The semiconductor device according to claim 8 including an additional inner dielectric segment disposed between adjacent contact spacer segments on adjacent sides of the first and second contacts.

10. The semiconductor device according to claim 9 wherein the additional inner dielectric segment comprises a dielectric material different from the dielectric material of the contact spacer segments.

11. The semiconductor device according to claim 8 including a metallic contact segment disposed between adjacent contact spacer segments on adjacent sides of the first and second contacts.

12. The semiconductor device according to claim 6 further including an additional peripheral dielectric segment disposed outward of an outer contact spacer segment adjacent the first contact.

13. The semiconductor device according to claim 12 further including an additional peripheral dielectric segment disposed outward of an outer contact spacer segment adjacent the second contact.

14. The semiconductor device according to claim 13 wherein the additional peripheral dielectric segments each comprises a dielectric material different from the dielectric material of the first and second contact spacer segments.

15. The semiconductor device according to claim 14 wherein the additional peripheral dielectric segments comprise a dielectric material different from the dielectric material of the outer contact spacer segments.

16. An integrated circuit comprising at least a semiconductor structure comprising:
   a substrate including at least one vertical fin extending from the substrate;
   a bottom source/drain region beneath the at least one vertical fin;
   a top source/drain region disposed above the at least one vertical fin;
   a metal gate structure;
   a contact coupled to the top source/drain region; and
   first and second contact spacers disposed on each side of the contact
   an insulative layer disposed abutting a bottom surface of the first and second contact spacers, abutting sidewall portions of the top source/drain region and sidewall portions of the metal gate structure, and a top surface of the bottom source/drain region.

17. The integrated circuit of claim 16, wherein the first and second contact spacers comprise a dielectric material configured to minimize erosion between the contact and the metal gate structure.

18. The integrated circuit of claim 17, wherein the dielectric material of the first and second contact spacers comprise at least one of silicon nitride, silicon carbon nitride and silicon oxycarbonitride.

19. The integrated circuit of claim 17, the semiconductor structure further comprising a hard mask segment disposed adjacent a peripheral segment of at least one of the first and second contact spacers, the hard mask segment comprising a dielectric material.

20. The integrated circuit of claim 19, wherein the dielectric material of the hard mask segment is different from the dielectric material of the first and second contact spacers.

* * * * *